(12) United States Patent
McGrath et al.

(10) Patent No.: US 8,435,086 B2
(45) Date of Patent: May 7, 2013

(54) VERTICAL CABLE MANAGER

(75) Inventors: Michael J. McGrath, New Lenox, IL (US); Max W. Hibner, Chicago, IL (US); Thomas Chung Yin Wong, Chicago, IL (US)

(73) Assignee: Panduit Corp., Tinley Park, IL (US)

( * ) Notice: Subject to any disclaimer, the term of this patent is extended or adjusted under 35 U.S.C. 154(b) by 0 days.

(21) Appl. No.: 13/423,404

(22) Filed: Mar. 19, 2012

(65) Prior Publication Data

US 2012/0175472 A1 Jul. 12, 2012

Related U.S. Application Data

(63) Continuation of application No. 12/954,974, filed on Nov. 29, 2010, now Pat. No. 8,162,699, and a continuation of application No. 12/709,886, filed on Feb. 22, 2010, now Pat. No. 7,857,670, and a continuation of application No. 12/258,507, filed on Oct. 27, 2008, now Pat. No. 7,695,323, and a continuation of application No. 11/850,446, filed on Sep. 5, 2007, now Pat. No. 7,458,859, and a continuation of application No. 11/086,815, filed on Mar. 22, 2005, now Pat. No. 7,285,027.

(60) Provisional application No. 60/555,387, filed on Mar. 22, 2004, provisional application No. 60/653,779, filed on Feb. 17, 2005.

(51) Int. Cl.
*H01R 19/22* (2006.01)

(52) U.S. Cl.
USPC .......................................... 439/719

(58) Field of Classification Search .................. 439/719, 439/701, 894, 540.1; 174/100, 136, 72 A, 174/135; 385/134, 136
See application file for complete search history.

(56) References Cited

U.S. PATENT DOCUMENTS

| 2,921,607 | A | * | 1/1960 | Caveney ........................ 138/106 |
| 3,554,236 | A | | 1/1971 | Rhodes | |
| 3,705,949 | A | | 12/1972 | Weiss | |
| 3,968,322 | A | * | 7/1976 | Taylor .......................... 174/72 A |
| 4,579,310 | A | | 4/1986 | Wells et al. | |

(Continued)

FOREIGN PATENT DOCUMENTS

| EP | 0695011 A2 | 1/1996 |
| WO | 0048410 A2 | 8/2000 |
| WO | 0174091 A2 | 10/2001 |

OTHER PUBLICATIONS

Panduit Communication Products Catalog, front cover and p. D33, 1998.

*Primary Examiner* — Alexander Gilman
(74) *Attorney, Agent, or Firm* — Robert A. McCann; Christopher S. Clancy; James H. Williams

(57) ABSTRACT

Certain embodiments of the present invention provide a bracket for mounting a vertical cable manager to a rack. The bracket includes a first portion extending in a first direction, a second portion extending from the first portion in a second direction substantially perpendicular to the first direction, and a third portion extending from the second portion in a third direction substantially perpendicular to the second direction and substantially parallel to the first direction. The first portion of the bracket is adapted to snap-fit to the vertical cable manager.

16 Claims, 12 Drawing Sheets

U.S. PATENT DOCUMENTS

| | | | |
|---|---|---|---|
| 4,665,546 A | 5/1987 | Brey et al. | |
| 5,277,006 A | 1/1994 | Ruster | |
| 5,918,837 A | 7/1999 | Vicain | |
| 5,921,402 A | 7/1999 | Magenheimer | |
| 6,011,221 A | 1/2000 | Lecinski et al. | |
| 6,070,742 A | 6/2000 | McAnally et al. | |
| 6,102,214 A * | 8/2000 | Mendoza | 211/26 |
| 6,127,631 A * | 10/2000 | Green et al. | 174/72 A |
| 6,129,316 A | 10/2000 | Bauer | |
| 6,140,584 A * | 10/2000 | Baldissara | 174/68.3 |
| 6,215,069 B1 * | 4/2001 | Martin et al. | 174/68.3 |
| 6,305,556 B1 | 10/2001 | Mayer | |
| 6,318,680 B1 * | 11/2001 | Benedict et al. | 248/49 |
| 6,347,714 B1 | 2/2002 | Fournier et al. | |
| 6,365,834 B1 | 4/2002 | Larsen et al. | |
| 6,378,828 B1 | 4/2002 | Valiulis et al. | |
| 6,403,885 B1 * | 6/2002 | Baker et al. | 174/68.3 |
| 6,468,112 B1 | 10/2002 | Follingstad et al. | |
| 6,489,565 B1 | 12/2002 | Krietzman et al. | |
| 6,605,782 B1 | 8/2003 | Krietzman et al. | |
| 6,686,541 B2 | 2/2004 | Chan | |
| 6,766,093 B2 * | 7/2004 | McGrath et al. | 385/134 |
| 6,785,459 B2 | 8/2004 | Schmidt et al. | |
| 6,805,248 B2 | 10/2004 | Champion et al. | |
| 6,818,834 B1 | 11/2004 | Lin | |
| 6,918,796 B2 | 7/2005 | Elliot et al. | |
| 6,964,588 B2 | 11/2005 | Follingstad et al. | |
| 7,000,784 B2 | 2/2006 | Canty et al. | |
| 7,083,051 B2 | 8/2006 | Smith et al. | |
| 7,119,282 B2 * | 10/2006 | Krietzman et al. | 174/101 |
| 7,172,078 B2 | 2/2007 | Abby et al. | |
| 7,178,679 B2 | 2/2007 | Canty et al. | |
| 7,207,835 B2 | 4/2007 | Levesque et al. | |
| 7,285,027 B2 | 10/2007 | McGrath et al. | |
| 7,331,473 B2 | 2/2008 | Smith et al. | |
| 7,378,046 B2 | 5/2008 | Canty et al. | |
| 7,458,859 B2 * | 12/2008 | McGrath et al. | 439/701 |
| 7,695,323 B2 | 4/2010 | McGrath et al. | |
| D626,817 S | 11/2010 | Donowho et al. | |
| 8,162,699 B2 * | 4/2012 | McGrath et al. | 439/701 |
| 2001/0030266 A1 | 10/2001 | MacDonald et al. | |
| 2003/0108322 A1 * | 6/2003 | Douglas et al. | 385/136 |
| 2004/0149486 A1 * | 8/2004 | Douglas et al. | 174/135 |
| 2005/0115737 A1 * | 6/2005 | Levesque et al. | 174/100 |
| 2005/0185912 A1 | 8/2005 | Levesque et al. | |
| 2010/0140422 A1 | 6/2010 | McGrath et al. | |

* cited by examiner

VERTICAL CABLE MANAGER

CROSS REFERENCES TO RELATED APPLICATIONS

This application is a continuation of U.S. application Ser. No. 12/954,974, filed Nov. 29, 2010, which is a continuation of U.S. application Ser. No. 12/709,886, filed Feb. 22, 2010, now U.S. Pat. No. 7,857,670 on Dec. 28, 2010, which is a continuation of U.S. application Ser. No. 12/258,507, filed Oct. 27, 2008, now U.S. Pat. No. 7,695,323, issued on Apr. 13, 2010, which is a continuation of U.S. application Ser. No. 11/850,446, filed Sep. 5, 2007, now U.S. Pat. No. 7,458,859, issued on Dec. 2, 2008, which is a continuation of U.S. application Ser. No. 11/086,815, filed Mar. 22, 2005, now U.S. Pat. No. 7,285,027, issued on Oct. 23, 2007, which claims the benefit of U.S. Provisional Application Ser. No. 60/555,387, filed Mar. 22, 2004, and U.S. Provisional Application Ser. No. 60/653,779, filed Feb. 17, 2005, the entire disclosures of which are hereby incorporated by reference.

FIELD OF THE INVENTION

This invention relates to cable managers for use with electronic equipment and more particularly to cable managers used with racks on which electronic equipment may be mounted.

BACKGROUND

A variety of cable managers (e.g., wiring duct and raceway systems) are known for routing the wires and cables of electronic equipment, such as telecommunications equipment and computers. In some cases, cable managers comprise a base member and a plurality of channels adapted to receive and route the wires and cables to and from the electronic equipment. Covers, which may be hinged, snap-latched, or otherwise engageable with the cable manager, may enhance cable retention and concealment. As the applications for telecommunications systems grow ever numerous and diverse, the need for more efficient communications management systems is increasing.

SUMMARY OF THE INVENTION

Certain embodiments of the present invention provide a bracket for mounting a vertical cable manager to a rack. The bracket includes a first portion extending in a first direction, a second portion extending from the first portion in a second direction substantially perpendicular to the first direction, and a third portion extending from the second portion in a third direction substantially perpendicular to the second direction and substantially parallel to the first direction. The first portion of the bracket is adapted to snap-fit to the vertical cable manager.

Certain embodiments of the present invention provide a vertical cable manager for a rack. The vertical cable manager includes a panel and a plurality of projections extending from the panel and disposed substantially perpendicular to the panel. The panel is adapted to receive a bracket for mounting the vertical cable manager to the rack. The bracket is adapted to snap-fit to the panel.

Certain embodiments of the present invention provide a vertical cable management system for a rack. The vertical cable management system includes a vertical cable manager and a bracket for mounting the vertical cable manager to the rack. The vertical cable manager includes a panel and a plurality of projections extending from the panel and disposed substantially perpendicular to the panel. The bracket includes a first portion extending in a first direction, a second portion extending from the first portion in a second direction substantially perpendicular to the first direction, and a third portion extending from the second portion in a third direction substantially perpendicular to the second direction and substantially parallel to the first direction. The first portion of the bracket snap-fits to the panel of the vertical cable manager such that the second portion of the bracket is flush with the spaced-apart projections.

BRIEF DESCRIPTION OF THE DRAWINGS

Certain embodiments of the presently claimed invention are illustrated by the accompanying figures. It should be understood that the figures are not necessarily to scale and that details not necessary for an understanding of the invention or which render other details difficult to perceive may be omitted. It should be understood, of course, that the invention is not necessarily limited to the particular embodiments illustrated herein.

DETAILED DESCRIPTION

Figure 1:
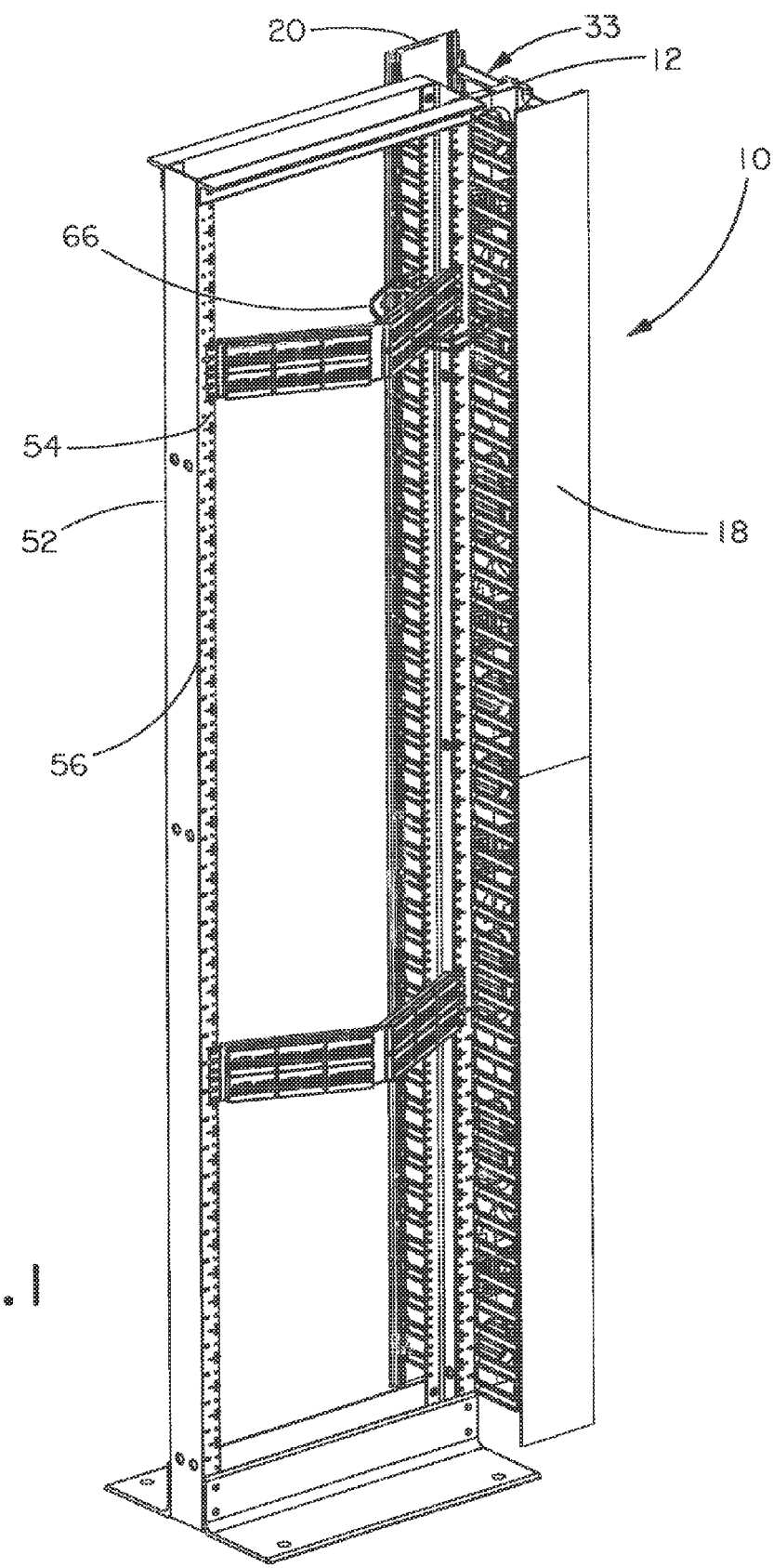
FIG. 1 is a front perspective view of one embodiment of the cable manager of the present invention.
Figure 2:
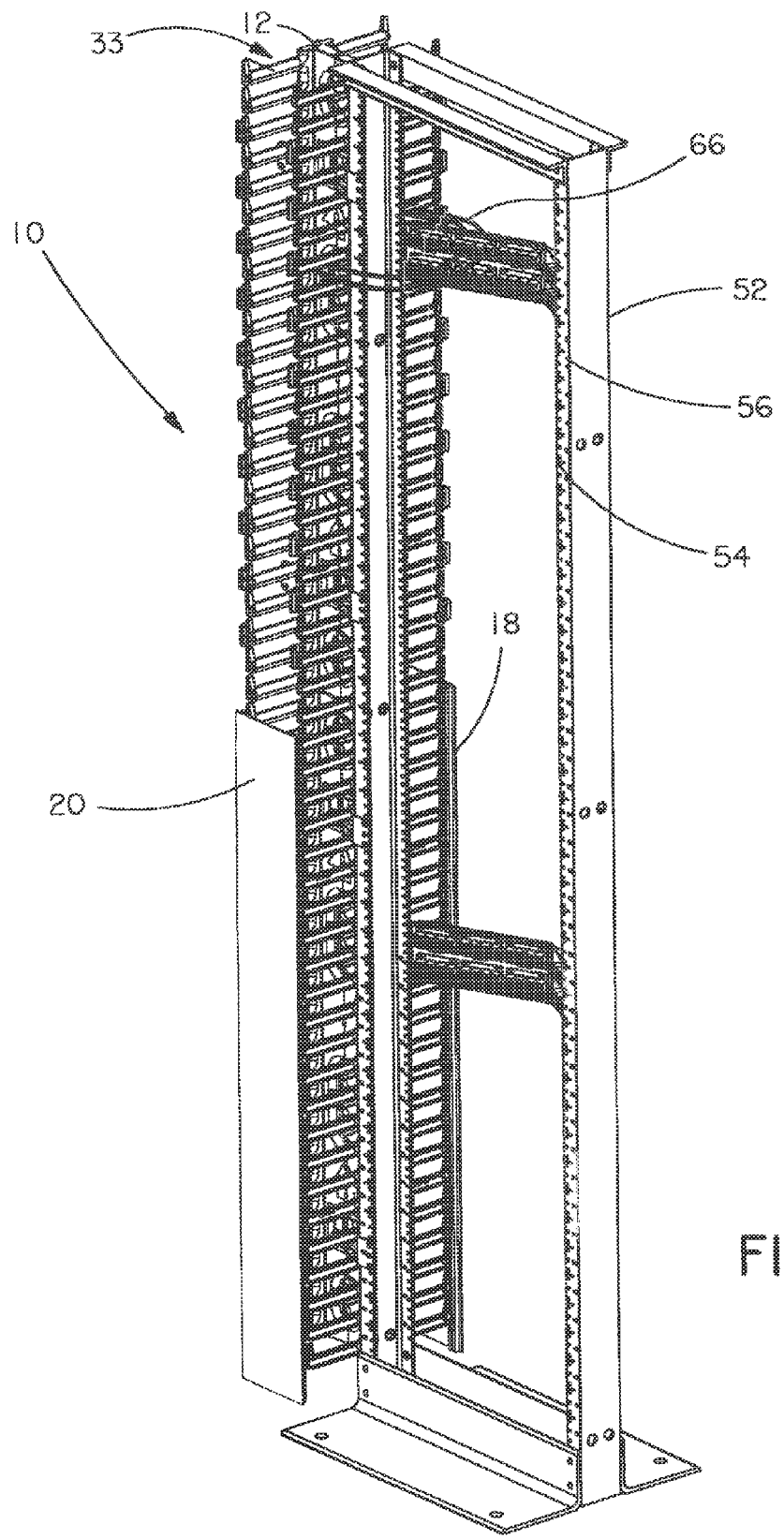
FIG. 2 is a rear perspective view of the cable manager shown in FIG. 1.
Figure 3:
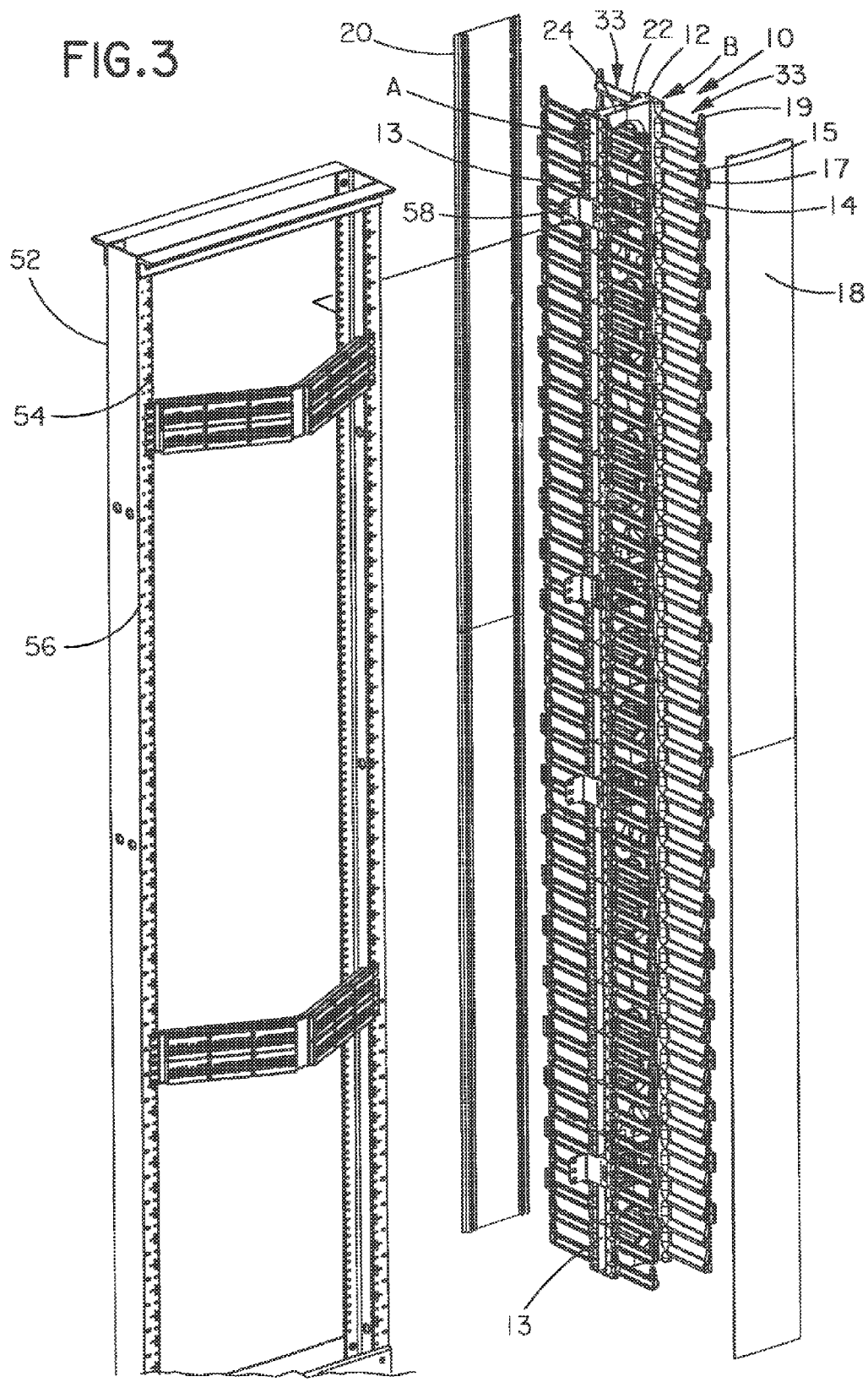
FIG. 3 is an exploded view of certain components of the cable manager shown in FIG. 1.

The present invention relates to cable managers for routing cables to and from electronic equipment, such as telecommunications equipment and computers. One embodiment of the cable manager 10 of the present invention is shown in FIGS. 1-3. Cable manager 10 comprises panel 12, at least two adjacent spaced-apart projections 14 and 15, at least one tab 16 and a plurality of open C-shaped projections 17. Cable manager 10 may optionally include front and rear doors 18 and 20.

As shown in FIG. 1, panel 12 includes a generally rectangular configuration. Panel 12 comprises front and rear surfaces 22 and 24 and a number of through-holes 26. Through-holes 26 allow cables to pass between front and rear surfaces 22 and 24 of central panel 12, and provide bend radius control for cables passing therethrough. Panel 12 may include spools (not shown) to enhance retention of cables within cable manager 10.

Figure 5:
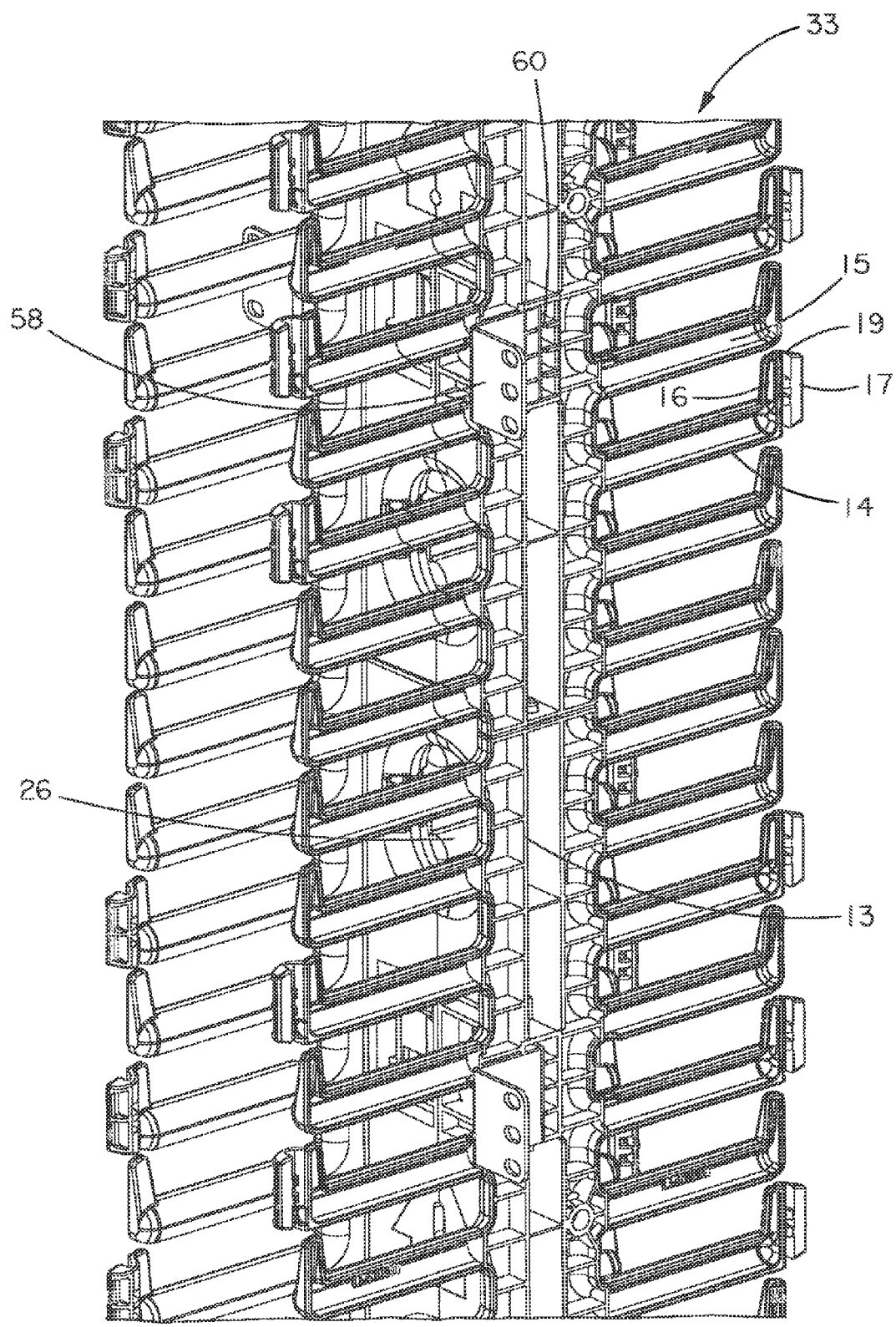
FIG. 5 is an enlarged perspective view of a portion of the cable manager shown in FIG. 1.

As best seen in FIG. 5, the at least two adjacent spaced-apart projections 14 and 15 comprise a spine portion 13, which is secured to opposing sides A and B of panel 12. The securement employed may include a nut and bolt arrangement or the like. Other securements known to those of skill in the art may, however, be employed.

Figure 6:
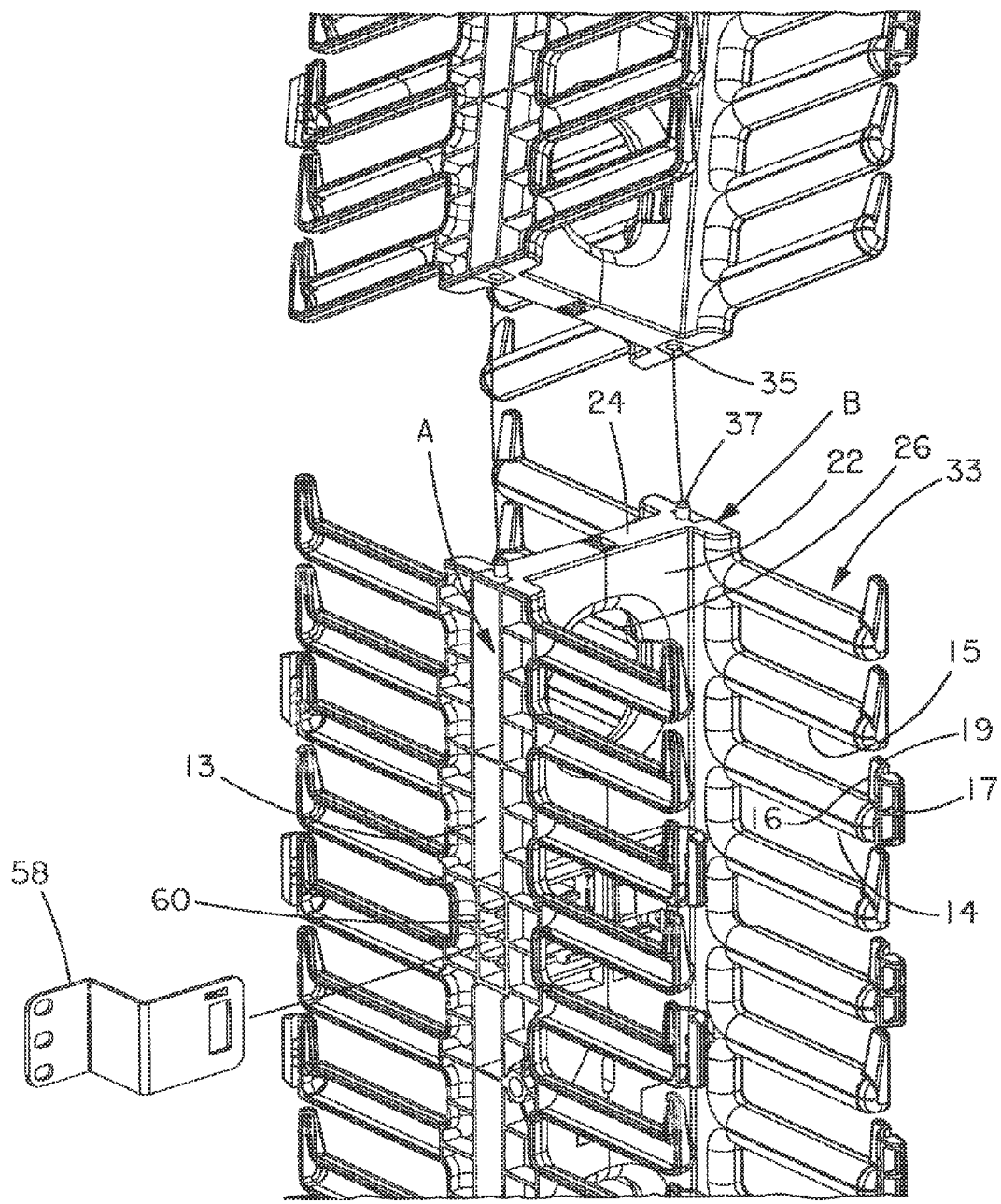
FIG. 6 is a broken away view of the cable manager of FIG. 5, showing the alignment means between two cable manager sections.

Projections 14 and 15 extend in a direction transverse to panel 12. In one embodiment, projections 14 and 15 extend in a direction perpendicular to the panel. In another embodiment, projections 14 and 15 comprise a plurality of projections positioned in a row 33 along opposing sides of panel 12. When two or more cable managers 10 are utilized together, rows 33 of projections 14 and 15 are aligned through the use of pin-holes 35 and bosses 37 positioned in a mating relationship on spine portions 13, as best seen in FIG. 6.

Figure 4:
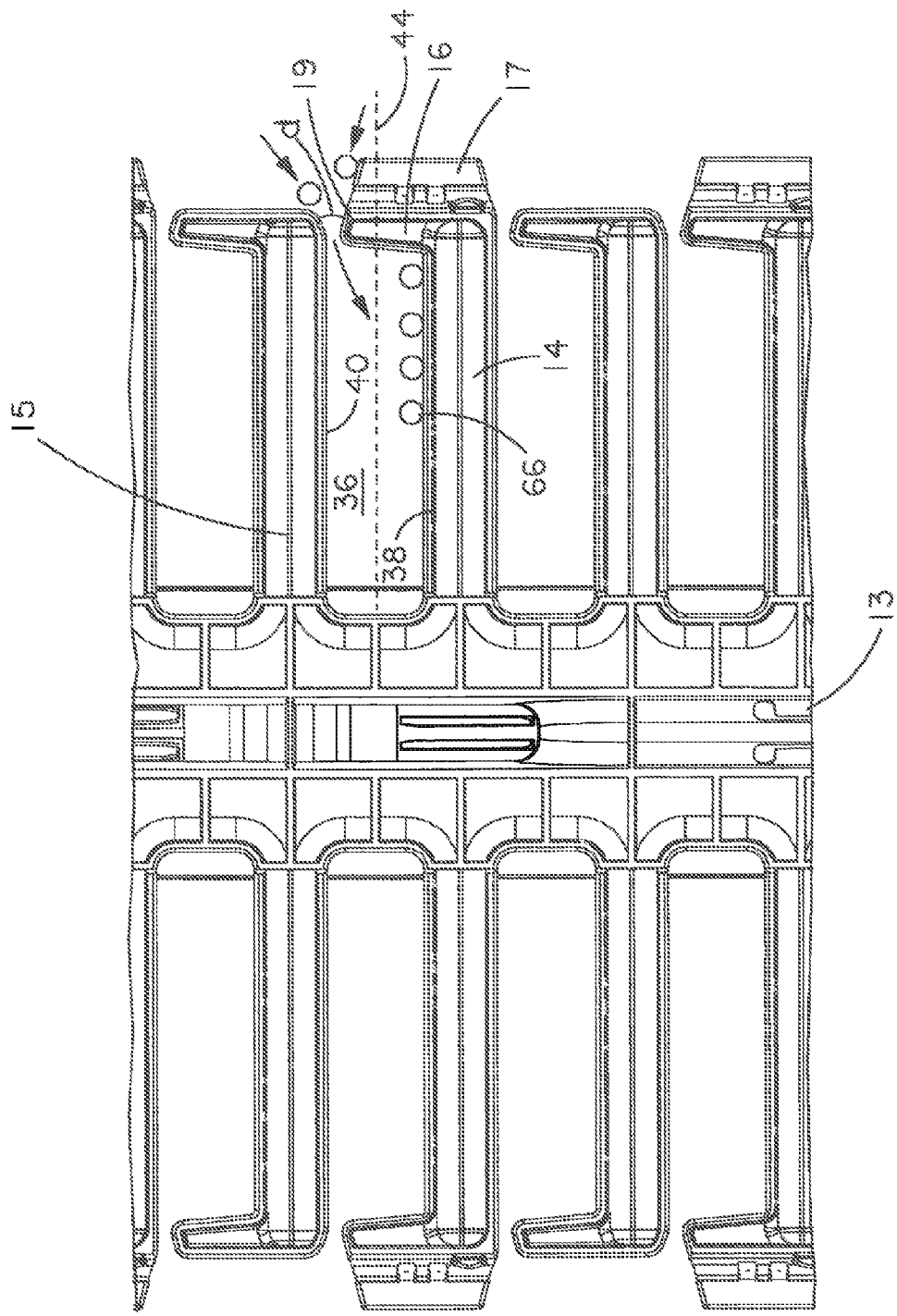
FIG. 4 is an enlarged side elevational view of four of the projections of the cable manager shown in FIG. 1.

As shown in FIG. 4, two adjacent projections 14 and 15 define opening 36. Opening 36 is positioned between a top surface 38 of one projection 14 and a bottom surface 40 of another projection 15. The size of opening 36 may be between about 1.0 inches and about 1.75 inches. Although other configurations are suitable, the at least two adjacent projections 14 and 15 are generally parallel to one another.

At least one tab 16 is connected to a distal end of the one projection 14. Tab 16 extends in a direction toward bottom surface 40 of the other projection 15. As shown in FIG. 4, tab 16 extends beyond a midpoint 44 of opening 36 defined by two adjacent projections 14 and 15. In one embodiment, the distance d between a top surface 19 of tab 16 on one projection 14 and a bottom surface 40 of other projection 15 is within a range of 0.10 inches and about 0.30 inches, more particularly between about 0.125 inches and about 0.275 inches. In one embodiment, d is about 0.14 inches. In these embodiments, tab 16, when viewed in combination with projection 14 to which it is connected, forms an L-shape.

The relationship between tab 16 on one projection 14 and other projection 15 is advantageous. Distance d is large enough to allow cables 66 to enter opening 36, while at the same time, small enough to prevent cables from sliding off a side of projections 14 and 15. Moreover, the positioning of tab 16 on one projection 14 relative to bottom surface 40 of other projection 15 permits a user to insert a maximum number of cables into opening 36 without the cables being positioned next to a point corresponding to d where cables enter opening 36.

Figure 10:
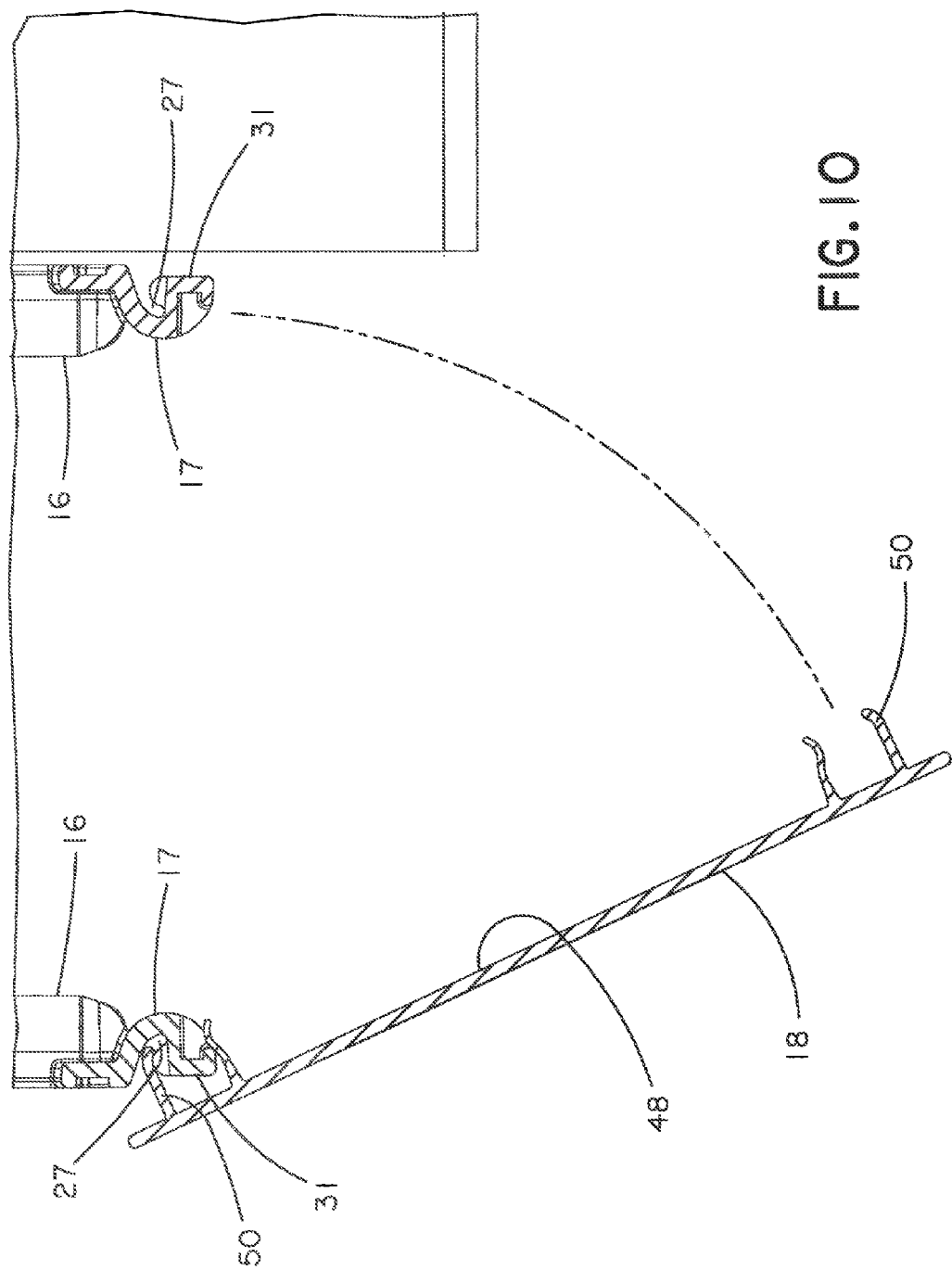
FIG. 10 is an enlarged side elevational view of the cable manager shown in FIG. 1 with the additional inclusion of a hinged door.

Referring again to FIGS. 1-3, to further enhance cable retention, front and rear doors 18 and 20 may be positioned in a spaced-apart relationship with panel 12. Doors 18 and 20 may be secured to the front and rear of cable manager 10 and may be swung open from either side of cable manager 10. For example, as shown in FIG. 10, door 18 opens from one side of cable manager 10. Inner surfaces 48 of front and rear doors 18 and 20 comprise U-shaped channels 50 that run along a length of front and rear doors 18 and 20. U-shaped channels 50 are adapted to engage the outer surfaces of C-shaped projections 17, which are oriented away from opposing rows 33 of projections 14 and 15.

Figure 7:
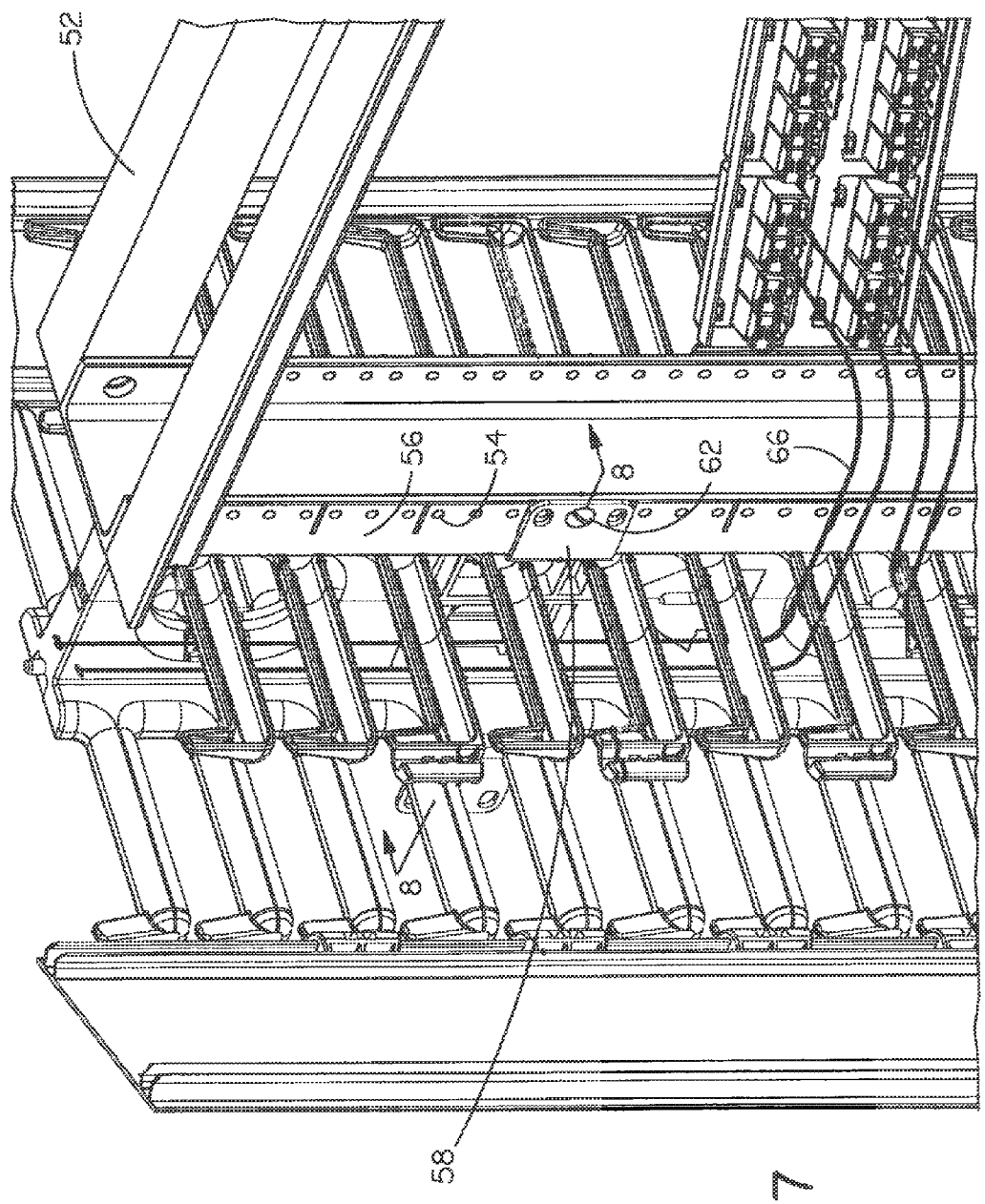
FIG. 7 is an enlarged perspective view of a portion of the cable manager shown in FIG. 1.
Figure 8:
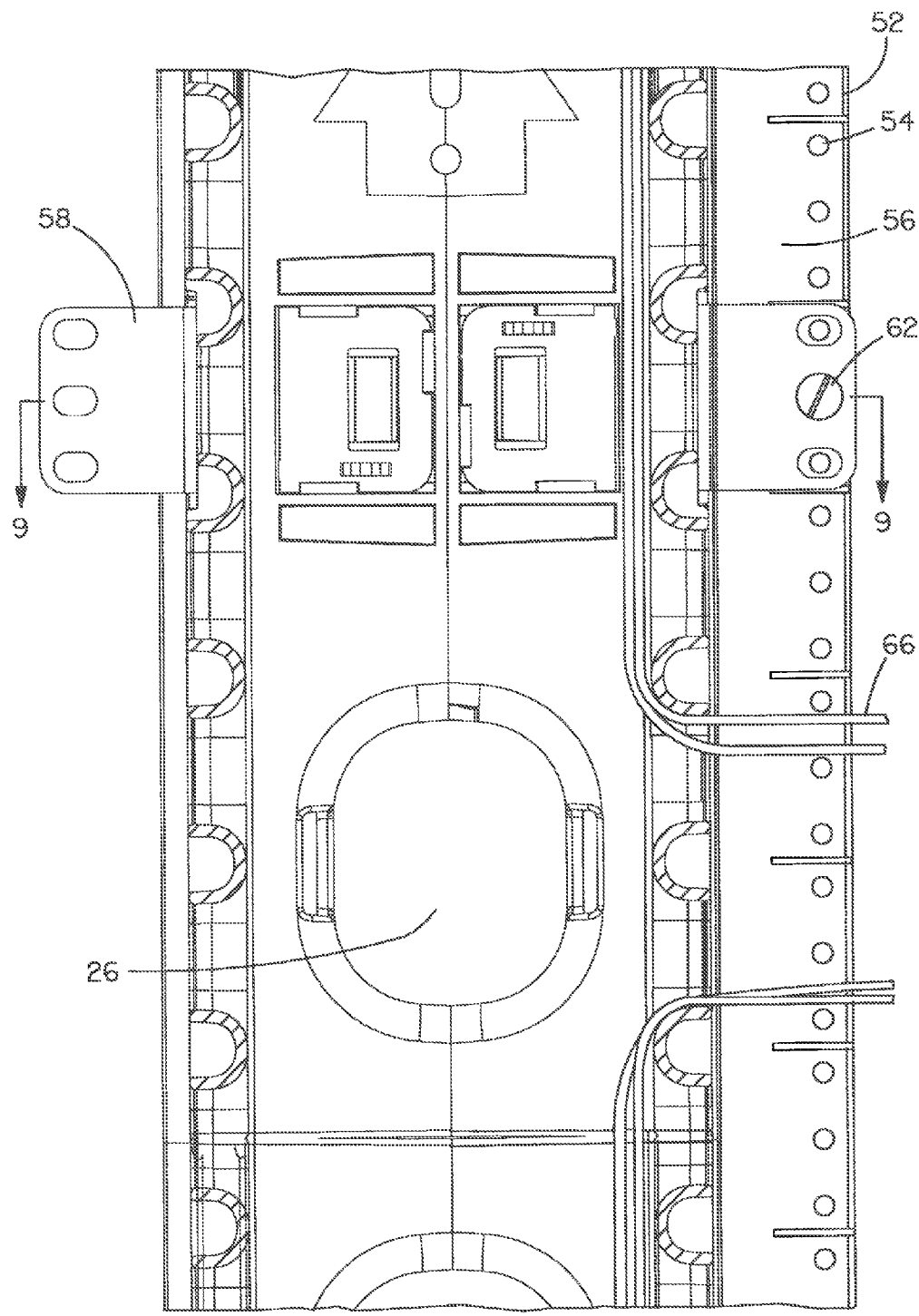
FIG. 8 is a cross-sectional view taken along lines 8-8 in FIG. 7.
Figure 9:
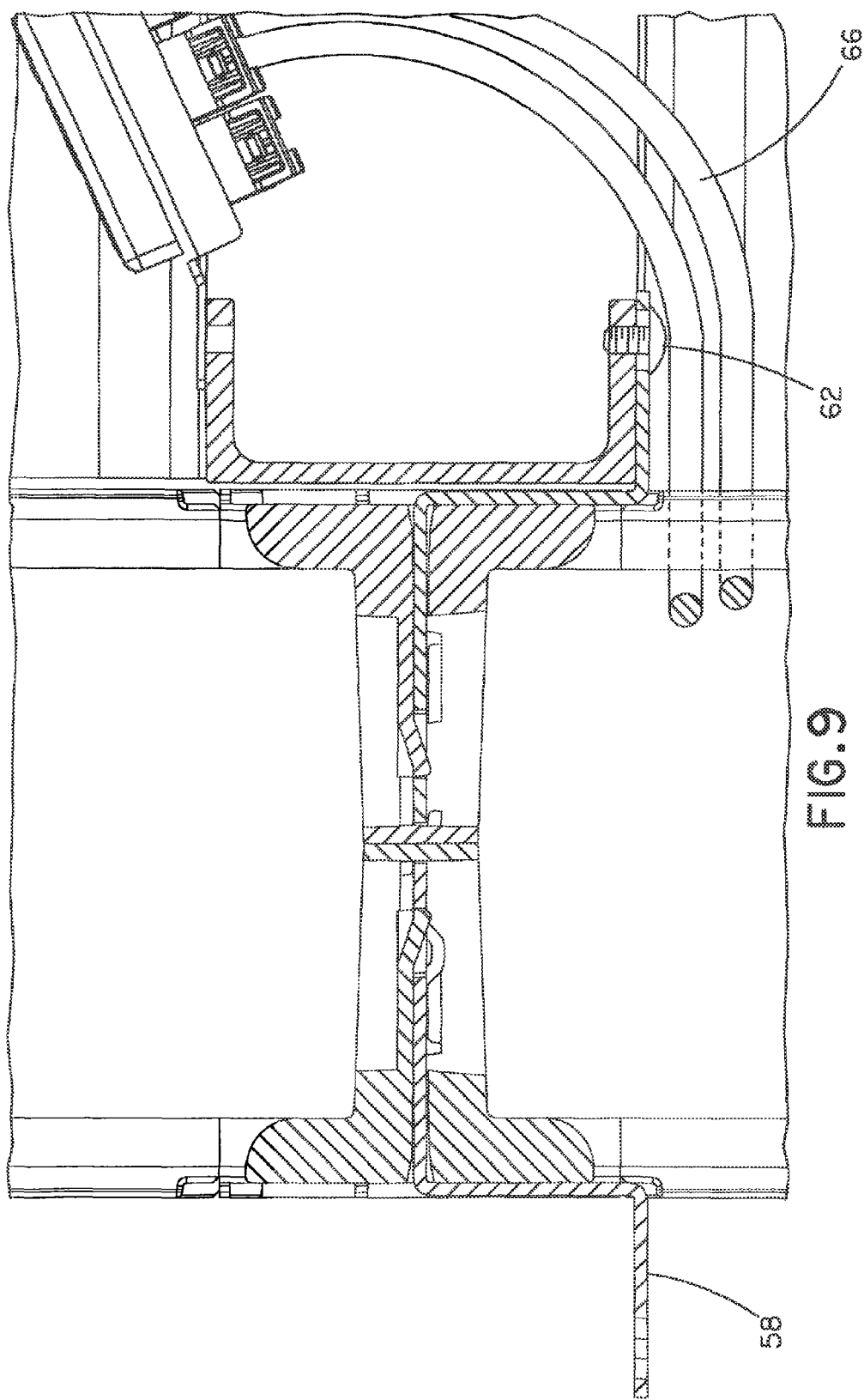
FIG. 9 is a cross-sectional view taken along lines 9-9 in FIG. 8.

Each C-shaped projection 17 is integrally molded with tab 16, as shown in FIG. 7. C-shaped projection 17 comprises groove 27 and flat surface 31, as best seen in FIG. 10. Groove 27 is adapted to receive a sidewall of U-shaped channel 50 so that doors 18 and 20 can swing open about C-shaped projections 17. This configuration optimizes the degree of rotation of doors 18 and 20.

Further, a user may determine the positioning of doors 18 and 20. When U-shaped channels 50 engage C-shaped projections 17 on opposing rows 33 of projections 14 and 15, doors 18 and 20 are closed. When U-shaped channels only engage C-shaped projections 17 along one row of projections, doors 18 and 20 may be swung open about the engaged C-shaped projections 17. Since C-shaped projections 17 are disposed on opposing rows of projections 14 and 15, doors 18 and 20 may be swung open in either direction.

The various components of the cable manager 10 may be made by injection molding, without the use of a metal backplane. For example, panel 12, rows 33 of projections 14 and 15 and doors 18 and 20 may be made as separate plastic components and then assembled through methods described hereinabove.

In use, cable manager 10 may be mounted to rack 52, as shown in FIG. 1. The term rack, as used herein, means a device used to support or house electronic equipment. A variety of racks may be employed, including racks that conform to the WECO and EIA standards known to those of skill in the art. Such racks comprise a plurality of rack mounting apertures 54 along a vertical member 56, as best seen in FIG. 7. Cable manager 10 may be secured to rack 52 through methods known to those of skill in the art.

After cable manager 10 has been mounted to rack 52, a plurality of cables 66 may be routed to and from electronic equipment. Cables 66 may be routed through openings 36 between adjacent projections 14. Tabs 16 help retain cables 66 and substantially prevent them from falling or slipping out of opening 36.

As shown in FIGS. 1 and 2, the cable manager 10 is mounted to a rack 52. The rack 52 may have various types of electrical equipment mounted thereto or otherwise situated thereon. One face of the rack may be utilized to accommodate input and output lines while the opposite face may be reserved for connecting cables for interconnecting specified inputs to specified outputs. In other embodiments, a rack system may include several racks adjacently aligned, with the rack on one end of the alignment accommodating input lines and the rack on the opposite end of the alignment providing output lines. In this arrangement, the cable connections within and between the intermediate racks may serve to connect the inputs and outputs in the desired configuration, as well as to provide pathways to and from the intermediate electrical components.

As shown in FIGS. 5-9, the cable manager 10 is mounted to the rack 52 through the use of one or more metal mounting brackets 58. The metal mounting brackets 58 are attached to a spine portion 13 of the cable manager 10 through the use of a snap-fit. As best seen in FIG. 6, the recessed area 60 in the spine portion 13 allows the wall thickness of the mounting bracket 58 to remain flush with the overall thickness of the cable manager 10. As shown in FIG. 5, once the mounting bracket 58 is fully engaged into the snap feature, the wall thickness of the mounting bracket 58 would be flush to the side of the cable manager 10. In other embodiments, the metal mounting brackets 58 may be attached to spine portion 13 of the cable manager 10 utilizing a screw and bolt or other methods known in the art. The mounting brackets 58 may be made of materials other than metal such as varying types of plastic or other compounds known in the art. For installation purposes, one or more screws 62 are threaded into rack mounting apertures 54 along a vertical member 56 of the rack 52.

Figure 11:
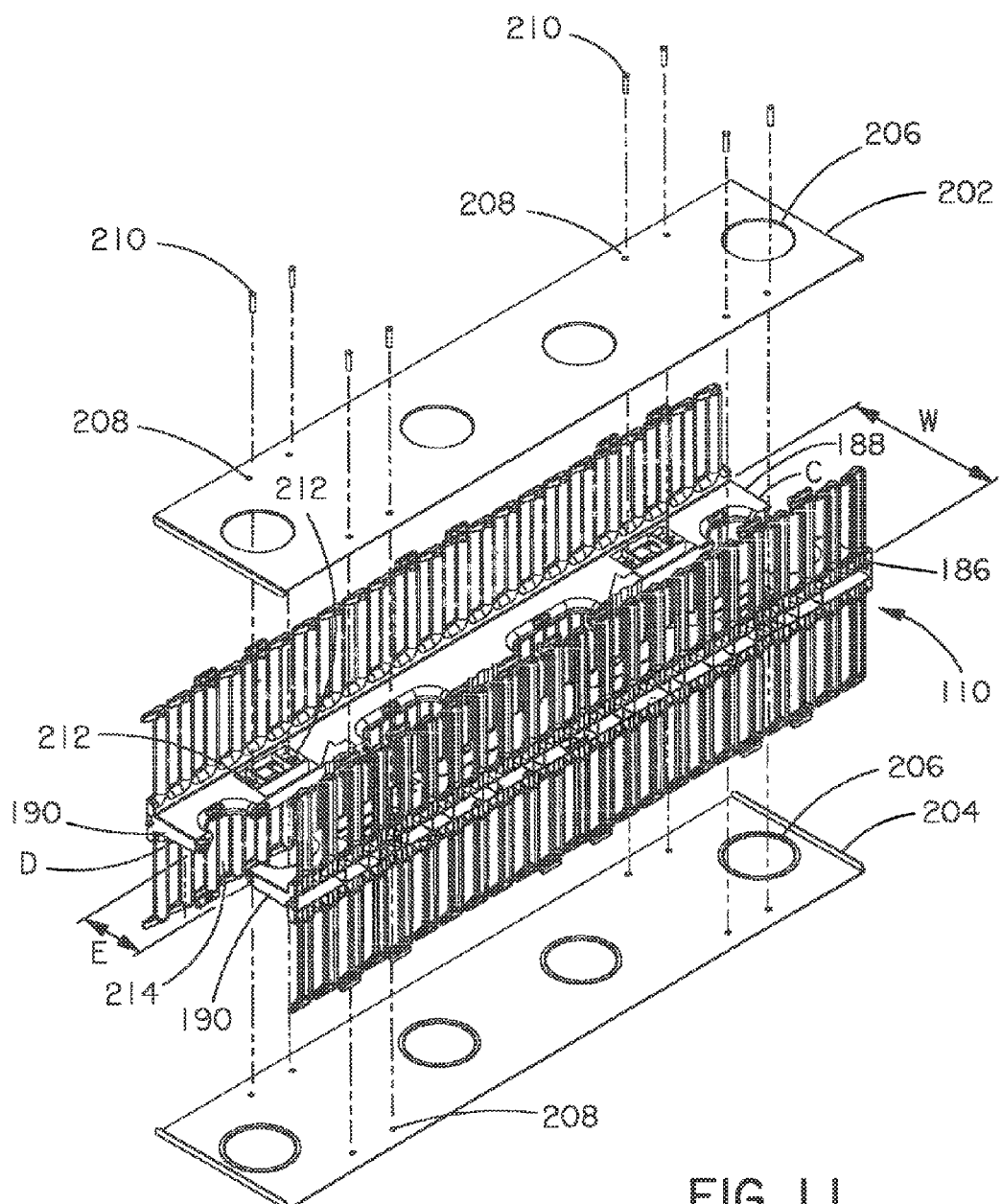
FIG. 11 is an exploded perspective view of the cable manager of FIG. 1 additionally showing two spacer members.
Figure 12:
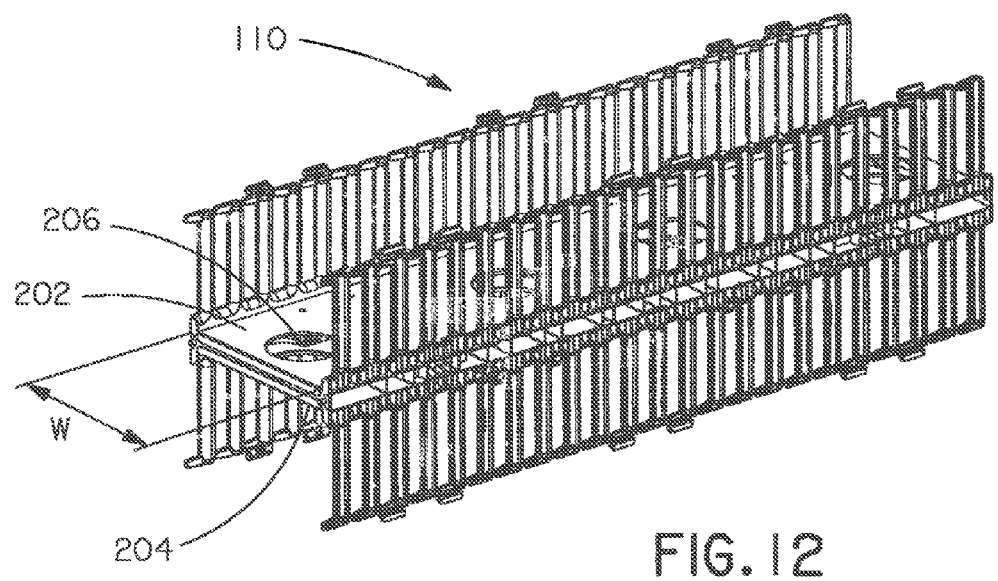
FIG. 12 is a perspective view of the assembled cable manager of FIG. 11.
Figure 13:
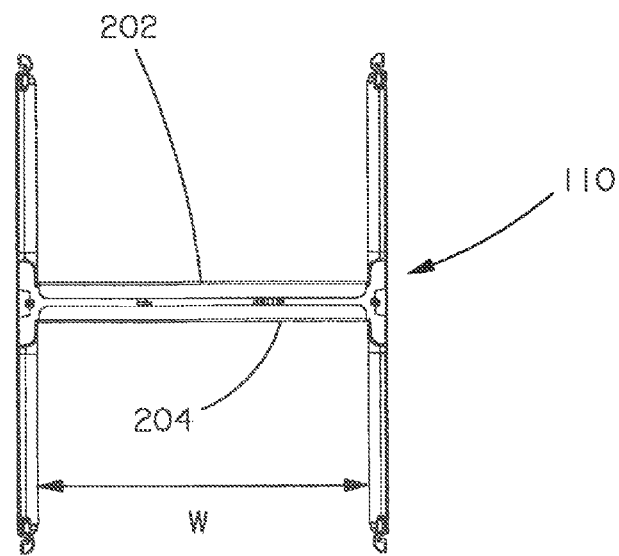
FIG. 13 is an end view of the cable manager of FIG. 12.

FIGS. 11-13 depict another embodiment in which two spacer members 202 and 204 are utilized to increase the width W between the first portion 186 and second portion 188 of the cable manager 110. The spacer members 202 and 204 are preferably made of sheet metal, but may comprise any material known in the art. Each of the spacer members 202 and 204 contains circular through-openings 206, which are adapted to allow cables to be run through the circular through-openings 206. Further, the spacer members 202 and 204 each contain a plurality of through-holes 208 adapted to engage a rivet 210. Similarly, each of the first and second portions 186 and 188 contain a plurality of through-apertures 212 adapted to engage a rivet 210. In other embodiments, the spacer members may contain one or more through-openings, and one or more through-holes, in any shape, configuration, or orientation known in the art. Similarly, in other embodiments, each of the first and second portions may contain one or more through-apertures in any shape, configuration, or orientation known in the art.

During installation, the first and second portions 186 and 188 of the cable manager 110 are spaced a distance E apart leaving a space 214 between the two portions 186 and 188. One of the spacer members 202 is placed over and abutted against side C of the base members 190 of the two portions 186 and 188, while the other spacer member 204 is placed under and abutted against side D of the base members 190 of the two portions 186 and 188. The through-holes 208 of the spacer members 202 and 204 are aligned with each other and with the through-apertures 212 of the first and second portions 186 and 188. In addition, the circular through-openings 206 of the spacer members 202 and 204 are aligned. Rivets 210 are then run from the through-holes 208 of the spacer members 202 and 204 through the apertures 212 of the first and second portions 186 and 188 in order to attach the spacer members 202 and 204 to the first and second portions 186 and 188 of the cable manager 110. In such manner, the spacer members 202 and 204 increase the width W between the first and second portions 186 and 188 of the cable manager 110, thereby allowing for more area to run cable within the cable manager 110, and additionally provide for increased width circular openings 206 through which cable may be run.

FIG. 13 depicts ten-inch wide spacer members 202 and 204, which are attached to a cable manager 110 which would normally be six-inches wide without the spacer members, to allow the total width W of the cable manager 110 to be extended an additional four inches to provide extra area to run cable within the manager 110. In other embodiments, one or more spacer members may be utilized in varying shapes, sizes, and configurations. The one or more spacer members may be attached to a cable manager utilizing snap-fits or any method known in the art.

Variations, modifications and other implementations of what is described herein will occur to those of ordinary skill in the art without departing from the spirit and scope of the invention. Accordingly, the invention is in no way limited by the preceding illustrative description.

The invention claimed is:

1. A cable manager comprising:
a panel;
a first projection connected to the panel;
a second projection connected to the panel and spaced apart from the first projection; and
a first tab connected to the first projection and spaced apart from the panel,
wherein the first tab and at least a portion of the first projection form an L-shape,
wherein the panel, the first projection, the second projection, and the first tab define a first opening for routing a first cable, and
wherein a top surface of the first tab is oblique with respect to a top surface of the first projection such that a distance between the top surface of the first tab and the top surface of the first projection increases as the first cable enters the first opening.

2. The cable manager of claim 1, wherein the top surface of the first tab is oblique with respect to a bottom surface of the second projection.

3. The cable manager of claim 2, wherein a distance between the top surface of the first tab and the bottom surface of the second projection decreases as the first cable enters the first opening.

4. The cable manager of claim 1, wherein the cable manager is a vertical cable manager.

5. The cable manager of claim 1, wherein the first tab is disposed at a distal end of the first projection.

6. The cable manager of claim 1, wherein the first tab extends from the first projection to a point at least midway between the first projection and the second projection.

7. The cable manager of claim 1, wherein the first projection and the second projection are aligned in a row or a column.

8. The cable manager of claim 1, wherein the first projection and the second projection are generally parallel to one another.

9. The cable manager of claim 1, wherein the first projection and the second projection extend in a direction perpendicular to the panel.

10. The cable manager of claim 1, further comprising a plurality of projections disposed in a row or a column along opposing sides of the panel.

11. The cable manager of claim 1, further comprising a C-shaped projection connected to the first tab.

12. The cable manager of claim 11, wherein a top surface of the C-shaped projection is aligned with the top surface of the first tab.

13. The cable manager of claim 12, wherein a top surface of the C-shaped projection is oblique with respect to the top surface of the first projection.

14. The cable manager of claim 1, further comprising a door rotatably and removably connected to the panel.

15. The cable manager of claim 14, further comprising a U-shaped channel connected to the door and a C-shaped projection connected to the first tab, wherein the U-shaped channel is adapted to engage the C-shaped projection.

16. The cable manager of claim 1, further comprising a bracket snap-fit to the panel for mounting the cable manager to a rack.

* * * * *